United States Patent [19]

Adams

[11] 4,271,365

[45] Jun. 2, 1981

[54] OPTOCOUPLER HAVING IMPROVED ISOLATION

[75] Inventor: Norbert Adams, Syracuse, N.Y.

[73] Assignee: General Electric Company, Auburn, N.Y.

[21] Appl. No.: 124,596

[22] Filed: Feb. 25, 1980

[51] Int. Cl.³ .............................................. G02B 27/00
[52] U.S. Cl. ........................................ 250/551; 357/11
[58] Field of Search ........................... 250/551; 357/19

[56] References Cited

U.S. PATENT DOCUMENTS 4,160,308  7/1979  Courtney et al. ................. 250/551 X

*Primary Examiner*—David C. Nelms
*Assistant Examiner*—Darwin R. Hostetter
*Attorney, Agent, or Firm*—Robert J. Mooney; Stephen B. Salai

[57] ABSTRACT

The isolation voltage of an optocoupler including a light transmissive inner region and a reflective or opaque outer region, the interface between such regions being intersected by input and output terminals, is improved by providing a layer of breakdown voltage enhancing material at the interface. In accordance with a preferred embodiment of the invention, a layer of glass frit is provided at the interface, the particles comprising the frit extending into each of the regions.

16 Claims, 6 Drawing Figures

OPTOCOUPLER HAVING IMPROVED ISOLATION

This invention relates in general to optocouplers and more particularly to isolating electrical optocouplers having improved isolation capabilities. Optocouplers, as employed herein, includes any of an increasing variety of devices which rely, in their operation, upon the transmission of light, including near light such as infrared and/or ultraviolet, for the control of an output device by an input device which is electrically isolated therefrom. Optocouplers allow for the coupling of systems without the need for electrical connection therebetween.

An important characteristic of optocouplers is the magnitude of the voltage differential which may be substained between the input and output terminals thereof without causing breakdown of the coupler. In many applications it is desirable to provide an optocoupler which is capable of withstanding potential differences between its input and output of thousands of volts. While such isolation voltage capabilities are theoretically easy to obtain by the expedient of increasing the separation between the input and output devices and/or providing materials of high dielectric strength therebetween, the usefulness of optocouplers depends, in addition to the isolation voltage characteristics of the device, upon the transfer characteristics of the device that is to say the amount of output signal produced by a given input signal, as well as the cost of the of the device. Increasing the spacing between the input and output devices of an optocoupler not only increases the cost of the device but degrades the performance thereof as respects the transfer characteristics since the attenuation of the transmission path between the input and output devices increases with square of the distance therebetween. It is, therefore, desirable from the standpoints of efficiency and cost to provide an optocoupler having as short a path between the input and output devices thereof as is consistent with the dielectric strength of the transmission medium.

In addition to voltage breakdown through the dielectric medium separating the input and output devices of an optocoupler, breakdown commonly occurs along interfaces between dissimilar materials which form such couplers. For example, it is desirable to provide a high dielectric strength transparent material between the input and output devices of an optocoupler while at the same time providing a material for the case of the coupler which prevents ambient light from entering the coupler while at the same time providing environmental protection and physical integrity therefore. The dielectric strength of the outer portion of an optocoupler package need not necessarily be as high as that of the transmission maferial since the distance between the input and output devices through the outer packaging material is for the most part greater than through the inner transmission material.

In some applications in order to still further enhance the transfer characteristics of an optocoupler, an additional layer which is reflective with respect to the radiation produced and detected by the input and output devices is interposed between the clear transmissive material and an opaque encapsulating material, where employed. Such a structure is illustrated, for example, in U.S. Pat. No. 4,179,619 the contents of which are herein incorporated by reference.

It is an object of this invention to provide an optocoupler having increased voltage breakdown characteristics over prior art devices.

It is another object of this invention to provide a higher isolation voltage optocoupler than heretofore possible without the necessity for increasing the transmission path length between the input and output devices thereof.

It is yet another objective of this invention to provide a high breakdown voltage optocoupler which may be manufactured at only slightly increased cost over prior art optocouplers having substantially inferior breakdown voltage characteristics.

Briefly stated and in accordance with one aspect of this invention, an optocoupler is provided having an emitter and detector spaced one from the other and coupled with respect to radiation created and detected thereby, by a transmissive region. Surrounding the transmissive region is an encapsulating region which may be formed of a similar or dissimilar material with respect to the transmissive region and which forms a first interface therewith. Breakdown voltage enhancing means are disposed at the interface for substantially increasing the resistance of the interface to voltage breakdown therealong.

In accordance with a presently preferred embodiment of this invention, ground glass frit including a plurality of irregularly shaped particles is disposed at the interface for substantially increasing the breakdown voltage of an optocoupler in accordance with this invention by increasing the arc path length along said interface.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
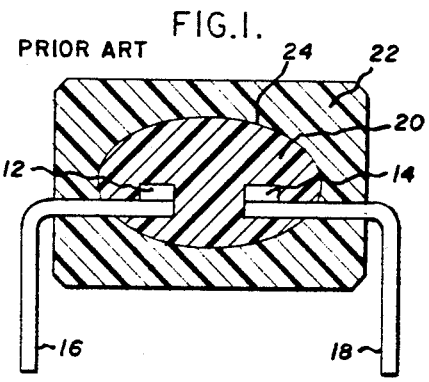
FIG. 1 is a section view of an optocoupler in accordance with the prior art.

Referring now to FIG. 1, a cross section view of an optocoupler in accordance with the prior art appears. In some cases the device of FIG. 1 may comprise an optocoupler provided in a dual in-line package to which package this invention is particularly readily applied. The essential elements of this and other optocouplers include an input device 12 and an output device 14 disposed in spaced apart relationship on first and second supporting members 16 and 18. Conveniently, supporting members 16 and 18 may form a portion of a conductive lead frame or the like for providing electrical contact to the input and output devices which may also be referred to as the emitter and detector elements. In this regard, other electrical connections may be made to the emitter and detector as well as to other portions of the lead frame, these connections and portions being omitted from the drawing for purposes of clarity. A light transmissive encapsulating region surrounds the emitter and detector for both enhancing the degree of electrical isolation therebetween and for permitting efficient transfer of radiation from the emitter to the detector. Conveniently, this transmissive region may be fabricated of a clear polymer such as silicone, a clear epoxy, glass, or any other suitable material compatible with the emitter and detector both environmentally and thermally and which provides the required degree of dielectric strength and transmissivity. Other techniques for electrically isolating the emitter and detector while providing for the transmission of radiation therebetween are known to the art, for example the structure shown in FIG. 4 with the exception of applicant's breakdown voltage enhancing layer. Transmissive region 20 may, if desired, include a radiation reflective outer portion for enhancing the transmission of light from the emitter to the detector as shown by the aforementioned U.S. Pat. No. 4,179,619. Surrounding the transmissive region 20 including any reflective portion thereof as is provided, is encapsulating region 22 which provides mechanical integrity for the device and which may, if desired, provide the aforementioned reflective property and which preferably isolates the transmissive region from external radiation which may provide spurious responses. In the case of light sensitive devices this is accomplished by selecting an opaque material for housing 22. Housing 22 may conveniently be formed of a similar or dissimilar material with respect to transmissive region 20 but in any case is generally selected to have at least the structural integrity of the inner region and preferably substantially greater rigidity and strength. Oftentimes encapsulating layer 22 and transmissive region 20 are both formed of silicon, an opaque dye or other suitable material being added to layer 22 to prevent the transmission of light therethrough, and layer 22 further being formulated to provide greater structural strength than layer 20. Interface 24 between regions 20 and 22 is oftentimes the weakest dielectric path between the input and output terminals of the device. The path, although long, is nevertheless oftentimes of less than optimum character for maximizing the dielectric strength thereof. This may be due to a number of factors such as incomplete or imperfect bonding between the inner and outer portions of the device, the presence of impurities along the interface which decrease the dielectric strength thereof and in extreme cases the presence of one or more actual gaps between the layers in which gaps moisture, for example, may collect, thereby significantly reducing the dielectric strength of the interface.

Figure 2:
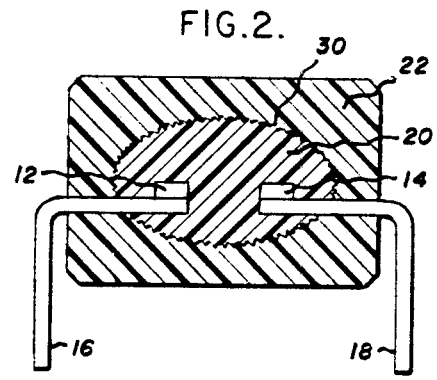
FIGS. 2 and 3 are section views of a high voltage optocoupler in accordance with this invention, FIG. 3 being an enlarged portion of the device of FIG. 2 particularly showing the interface between the inner and outer regions thereof.
Figure 3:
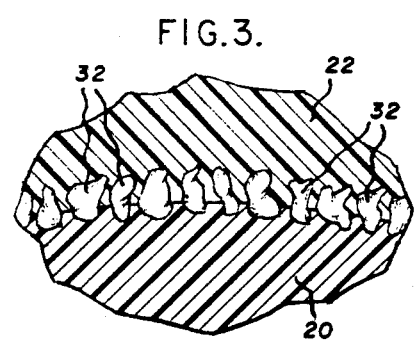

FIG. 2 is a cross sectional view of an optocoupler in accordance with one embodiment of this invention and FIG. 3 is an expanded view of a portion of an interface of FIG. 2. In FIGS. 1 and 2 as well as throughout the remainder of this discussion, like elements are designated by like reference numerals. An emitter 12 and a detector 14 are mounted on input and output terminals 16 and 18 respectively. Emitter 12 and detector 14 may be any of those devices known in the art for converting an electrical signal to a radiant signal and visa versa. Typically, emitters and detectors are employed having characteristic radiation in the visible or near infrared range although it should be understood that his invention is not so limited. Conveniently, leads 16 and 18 may form a portion of a dual in-line package of the type commonly employed for housing optocouplers and other semiconductor devices such as integrated circuits. Leads 16 and 18 are exemplary of one or more additional leads which may be provided for completing connection to emitter and detector elements 12 and 14 respectively through other metallic elements such as wires which are not illustrated for purposes of clarity in which, as such, form no particular part of this invention. Emitter and detector 12 and 14 are coupled by radiation transmissive region 20 which is selected for low attenuation of the characteristic wavelength of the emitter and detector pair. Conveniently transmissive region 20 may be of silicone material which may be applied in a liquid state and subsequently cured. It is pointed out that FIG. 2 is not drawn to any particular scale, light transmissive region 20 having a size relative to the other dimensions of the package which may be determined based upon considerations in addition to those relevent for the purposes of this invention. For example, it is desirable that transmissive region 20 be as small as possible enhancing the transfer of light between the emitter and the detector. On the other hand, a larger region may be desirable inasmuch as it provides a longer outside boundry which increases the dielectric strength of the device. Still further, region 20 may include therein a reflective outer portion as described by the aforementioned patent for increasing the radiation transfer between the emitter and detector. Where such a reflective region is employed, it is preferred that it be homogeneous with the remainder of region 20 and have no boundry therewith. Light transmissive region 20 is surrounded by encapsulating body 22 which, in a preferred embodiment of this invention, is also formed of silicone. Body 22 is preferably a substantially rigid opaque body which may conveniently be molded in a liquid form and subsequently cured. While radiation transmissive region 20 need not, even in its fully cured state, exhibit exceptional rigidity, nevertheless encapsulating body 22 should be rigid in its final form to provide sufficient mechanical strength to support leads 16 and 18.

In accordance with this invention, the isolation voltage capabilities of an optocoupler as described are enhanced by providing at the interface between transmissive region 20 and encapsulating region 22 a layer of dielectric strength enhancing material which, in accordance with a preferred embodiment hereof, may be a layer of irregularly shaped particles of glass or other insulating material which intersects the boundry between light transmissive region 20 and encapsulating body 22. The particular shape of the particles is important only insofar as they be sufficiently irregular to insure that the particles extend at least partially into each of regions 20 and 22 and are not wholly within one region or the other. It has been found that glass frit is an especially effective dielectric strength-enhancing material. The size of the particles is not particularly critical but, nevertheless, it has been found that particles having dimensions on the order of approximately 200–400 microinches provide good results. Where particles are provided which are too large, surface tension during the application of the particles may cause them to be completely drawn into the light transmissive region 20. Similarly, if the particles are too small their effectiveness in increasing the isolation voltage will be diminished. While the particular shape of the glass particles is not critical, it has been found that round glass beads tend to be coated completely by the material comprising transmissive region 20 and, therefore, ineffective. A presently preferred material is GE 351 glass frit which is available from General Electric Company, Lamp Glass Products Dept., Cleveland, Ohio. It is expected that other ground glasses will perform satisfactorily in this application.

While ground glass and other irregularly shaped insulating bodies are preferred, it is felt that even non-insulating bodies may provide some advantages when employed in accordance with the teachings of this invention. Accordingly, those skilled in the art will recognize that in addition to glass, materials of somewhat reduced dielectric strength such as ground epoxy, walnut shucks and the like may be employed. Even conductive particles can be expected to provide some improvement if they are spaced along the boundary between the light transmissive and encapsulating regions so that they do not contact each other and create a low resistance path between the input and output at the boundary. Where the capacitance which is added by such non-insulating bodies is intolerable, insulating bodies should be employed.

Where an epoxy or similar material exhibiting substantial hardness is employed for forming light transmissive region 20, the advantages of this invention may be obtained by roughening the surface thereof by, for example, sand blasting or other suitable technique for increasing the arc length path thereof.

Figure 4:
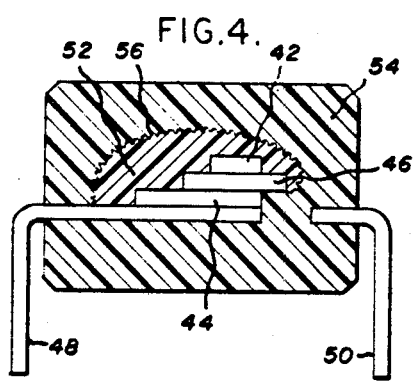
FIG. 4 is a section view of an optocoupler in accordance with yet another aspect of this invention.

Referring now to FIG. 4, an optocoupler in accordance with an alternative embodiment of this invention is illustrated. An emitter 42 and detector 44 are mounted on opposite sides of transmissive insulating layer 46. Detector 44 is connected to output terminal 48 while emitter 42 is connected to input terminal 50. Input and output terminals 50 and 48 correspond in general to terminals 16 and 18 of FIGS. 1 and 2 both as to form and function with the exception of modifications to allow for the distinct arrangement of the emitter and detector elements thereon. Conveniently, emitter 42 and detector 44 are the same type of devices as have been hereinabove described in conjunction with emitter 12 and detector 14. Certain changes in form and in the location of contacts thereon may be made in order to adapt the devices to the package of FIG. 4. Insulating layer 46 may conveniently be a glass layer having one or more patterned electrodes thereon for contacting the emitter and detector devices. An inner light transmissive region 52 and an outer encapsulating body 54 are partially separated by boundary 56. The requirements for transmissivity of region 52 are substantially reduced over those imposed on region 20 hereinabove discussed inasmuch as transmission of radiation from emitter 42 to detector 44 is primarily through transmissive insulator 46. It will be appreciated that emitter 42 and detector 44 are mounted on opposite sides of transmissive insulator 46 in face-to-face relationship with respect to their primary emitting and detecting surface portions. Layer 52 may include a reflective outer portion as has been hereinabove described although the requirements therefor are less pronounced in accordance with this type of structure compared to the structures of FIGS. 1 and 2.

It will be appreciated by reference to FIG. 4 that the boundary 56 between encapsulating body 54 and light transmissive region 52 does not completely surround the emitter-detector combination. Nevertheless, it has been found that this boundary represents the most likely location for breakdown between the input and output terminals of the device and high voltage isolation applications. The application of a breakdown voltage enhancing layer to boundary 56 of the device of FIG. 4 is the same as has been hereinabove described in conjunction with FIG. 2. Similar light transmissive materials and encapsulating materials may be employed and similar materials and methods for applying the breakdown voltage enhancing layer may also be utilized.

Figure 5:
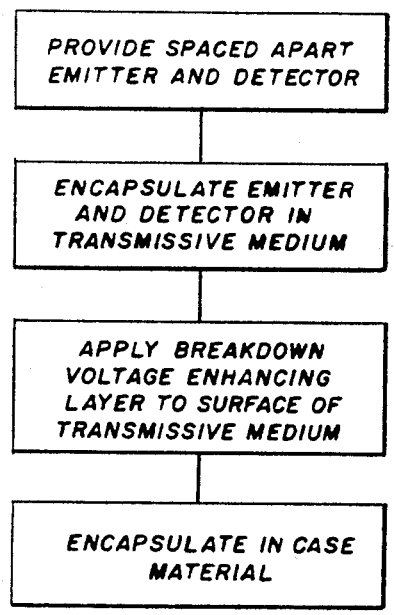
FIG. 5 is a flow chart representation of the steps for forming a high voltage optocoupler in accordance with this invention.

FIG. 5 is a flow chart type diagram of a method for forming a high isolation voltage optocoupler in accordance with this invention. A spaced apart emitter and detector pair are first provided. The emitter and detector may conveniently be a semiconductor emitter and detector as, for example, a light-emitting diode or infrared emitting diode and a matching semiconductor detector such as a photo-sensitive transistor, thyristor or the like. The appropriate spacing may be provided as illustrated, for example, in FIG. 1 by mounting the emitter and detector on a lead frame or as illustrated in FIG. 4, by mounting the emitter and detector to an insulating transmissive interface. Other methods will undoubtedly occur to those skilled in the art. The emitter and detector pair are then encapsulated in a transmissive medium which may encompass part or all of the emitter and detector elements. The transmissive medium may include an outer reflective portion for enhancing the transfer of radiation from the emitter to the detector. Preferably, a medium is employed which may be applied in a liquid or semiliquid form and subsequently cured to a solid or semisolid state. The cured medium need not be completely rigid and, in fact, in order to protect the emitter and detector as well as any electrical connections thereto from damage during thermal cycling, it may be preferred to provide a resilient transmissive medium which does not unduly stress the emitter and detector or the connections thereto during such cycling in normal operation. After the application of the transmissive medium, a breakdown voltage enhancing layer is applied to the surface thereof. Preferably the breakdown voltage enhancing layer is applied while the surface is still liquid or at least tacky so that physical attachment thereto results. In the case where ground glass frit is employed, it is preferred that the medium be sufficiently soft so that the glass frit actually penetrates the medium although not completely. Where a substance other than a frit is employed, the surface of the transmissive medium should be receptive to the application of the breakdown voltage enhancing layer at the time it is applied. After the application of the breakdown voltage enhancing layer, the structure is encapsulated in a housing material which may also be a material applied in a liquid form which is subsequently cured to provide a rigid housing for the device. Preferably the housing material is opaque to external radiation and physically compatible with the remaining elements of the device. The breakdown voltage enhancing layer cooperates with the encapsulating housing so as to insure that the boundary between the encapsulating housing and the transmissive region is of high dielectric strength so that breakdown between the input and output terminals of the device does not occur therealong. Where a breakdown voltage enhancing layer of frit is employed, the particles thereof preferably extend into the housing material as well as into the transmissive medium.

Figure 6:
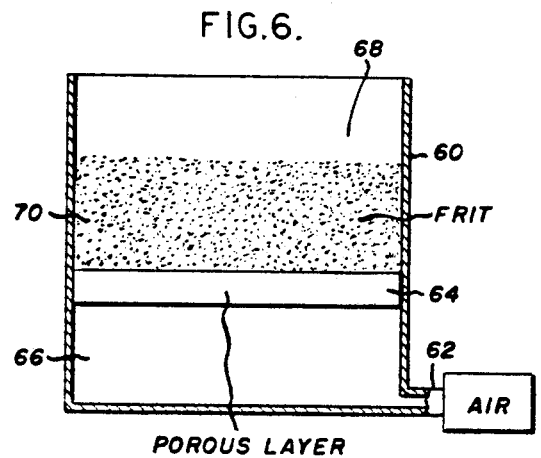
FIG. 6 is a diagrammic view of apparatus for applying a breakdown voltage enhancing layer in accordance with this invention.

FIG. 6 illustrates a cross section view of fluidizer apparatus for applying a glass frit to an optocoupler in accordance with this invention. Housing 60 is provided with an input fitting 62 which is connected to a source of pressurized air. A layer 64 of porous material such as a porous stone divides housing 60 into a lower chamber 66 and an upper chamber 68. Lower chamber 66 is pressurized by the air source connected to fitting 62 to cause a supply of glass frit 70 to be suspended in upper chamber 68. After the emitter and detector elements are encapsulated in a transmissive medium as discussed in conjunction with FIG. 5, the device is then introduced into upper chamber 68 in contact with the layer of suspended frit 70 so that the outer surface of the transmissive medium is coated with the frit. The apparatus of FIG. 6 may be readily adapted to suit particular forms of optocouplers both those described hereinabove and others which will be obvious to those skilled in the art. For example, where a large number of optocouplers is simultaneously formed on a lead frame, the apparatus of FIG. 6 may be readily adapted to receive one or more of such lead frames simultaneously so as to provide a voltage enhancing layer on a large plurality of partially formed optocouplers at low cost.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. In an electrical device having separately formed inner and outer insulative portions having a boundary therebetween, said boundary intersecting an input and an output terminal, the improvement for increasing the breakdown voltage of the device comprising:
 a layer of breakdown voltage enhancing material between said inner an outer insulative portions for increasing the dielectric strength of said device along said boundary.

2. The device of claim 1 further comprising a radiation source and a radiation sensor disposed in spaced apart relationship in said inner portion and connected to said input and output terminals respectively.

3. The device of claim 2 wherein said inner portion comprises a region of radiation transmissive insulative material.

4. The device of claim 3 wherein said material comprises a curable material.

5. The device of claim 4 wherein said material comprises a material selected from the group consisting of silicone and epoxy.

6. The device of claim 1 wherein said layer of breakdown voltage enhancing material comprises a layer of irregularly shaped particles.

7. The device of claim 6 wherein said particles comprise particles of insulating material.

8. The device of claim 1 wherein said layer of breakdown voltage enhancing material comprises a layer of ground glass frit.

9. The device of claim 8 wherein said layer of glass frit comprises a layer of particles which particles extend into each of said inner and outer portions.

10. An optoelectric device comprising:
 an optical source having an input electrical connection thereto,
 first means disposed between said optical source and said optical sensor for optically coupling said optical source and said optical sensor,
 second means encapsulating said first means, said optical source and said optical sensor and forming a boundary with said first means, said boundary intersecting said input electrical connection and said output electrical connection,
 a layer of dielectric strength enhancing material disposed between said first and second means for increasing the dielectric strength of said device along said boundary.

11. The device of claim 10 wherein said source comprises a semiconductor infrared emitting diode and said sensor comprises a semiconductor detector responsive to the light produced by said emitter.

12. The device of claim 10 wherein said first means for optically coupling said optical source and said optical sensor comprises a region of light transmissive dielectric material.

13. The device of claim 12 wherein said second means comprises a body of optically opaque dielectric material.

14. The device of claim 10 wherein said layer of dielectric strength enhancing material comprises a layer of particles extending into both said first and second means.

15. In an electrical device having separately formed inner and outer insulative portions having a boundary therebetween, said boundary intersecting an input and an output terminal of said device, the improvement for enhancing the breakdown voltage of said device between said input and said output terminals comprising:
 means disposed at said boundary for increasing the dielectric strength of said device therealong.

16. The device of claim 15 wherein said means for increasing the dielectric strength of said device comprises means for increasing the arc length path along said boundary.

* * * * *